United States Patent
Duclos

(10) Patent No.: US 9,121,502 B2
(45) Date of Patent: Sep. 1, 2015

(54) DOUBLE-SEALING DEVICE FOR A MACHINE FOR THE PLASMA TREATMENT OF CONTAINERS

(75) Inventor: Yves-Alban Duclos, Octeville sur Mer (FR)

(73) Assignee: SIDEL PARTICIPATIONS, Octeville sur Mer (FR)

( * ) Notice: Subject to any disclaimer, the term of this patent is extended or adjusted under 35 U.S.C. 154(b) by 1532 days.

(21) Appl. No.: 12/446,079

(22) PCT Filed: Oct. 17, 2007

(86) PCT No.: PCT/FR2007/001717
§ 371 (c)(1),
(2), (4) Date: Aug. 5, 2009

(87) PCT Pub. No.: WO2008/050001
PCT Pub. Date: May 2, 2008

(65) Prior Publication Data
US 2010/0007100 A1    Jan. 14, 2010

(30) Foreign Application Priority Data
Oct. 18, 2006    (FR) .................................... 06 09142

(51) Int. Cl.
*F16J 15/02* (2006.01)
*F16J 15/00* (2006.01)
*C23C 16/44* (2006.01)
*C23C 16/04* (2006.01)

(52) U.S. Cl.
CPC ........... *F16J 15/004* (2013.01); *C23C 16/4409* (2013.01); *C23C 16/045* (2013.01); *F16J 15/022* (2013.01)

(58) Field of Classification Search
CPC ....... F16J 15/002; F16J 15/021; F16J 15/022; F16J 15/104; C23C 16/4401; C23C 16/045; C23C 16/4409
USPC .................................. 277/628, 637; 118/733
See application file for complete search history.

(56) References Cited

U.S. PATENT DOCUMENTS

| | | | | |
|---|---|---|---|---|
| 5,521,351 | A * | 5/1996 | Mahoney | 219/121.59 |
| 5,565,248 | A * | 10/1996 | Plester et al. | 427/571 |
| 5,849,366 | A * | 12/1998 | Plester | 427/491 |
| 6,223,683 | B1 * | 5/2001 | Plester et al. | 118/723 VE |
| 6,242,053 | B1 * | 6/2001 | Anderle et al. | 427/488 |
| 6,276,296 | B1 * | 8/2001 | Plester | 118/723 R |
| 7,810,527 | B2 * | 10/2010 | Mouchelet et al. | 141/165 |
| 7,888,619 | B2 * | 2/2011 | Duclos | 219/121.47 |
| 2003/0217527 | A1 * | 11/2003 | Luttringhaus-Henkel et al. | 53/79 |
| 2008/0035613 | A1 * | 2/2008 | Duclos | 219/121.47 |

FOREIGN PATENT DOCUMENTS

| | | |
|---|---|---|
| BE | 399 856 A | 11/1933 |
| EP | 0937785 A2 | 8/1999 |
| FR | 2 872 148 A | 12/2005 |

OTHER PUBLICATIONS

BE 399856 Machine Translation.*

* cited by examiner

*Primary Examiner* — Kristina Fulton
*Assistant Examiner* — Nicholas L Foster
(74) *Attorney, Agent, or Firm* — Sughrue Mion, PLLC

(57) ABSTRACT

Sealing device (23) for a machine (1) for the plasma treatment of containers (2), comprising at least first and second annular sealing surfaces (24, 25) suitable for cooperating respectively with first and second separate annular zones (13, 15) of the neck (12) of a container (2).

6 Claims, 4 Drawing Sheets

DOUBLE-SEALING DEVICE FOR A MACHINE FOR THE PLASMA TREATMENT OF CONTAINERS

FIELD OF INVENTION

The invention relates to the treatment of containers, consisting of coating their inner wall with a layer of a barrier-effect material.

BACKGROUND

To that end, a machine is customarily used comprising an electromagnetic wave generator, a chamber connected to the generator and made of a conductive material (generally metal), and an enclosure provided in the chamber and made of a material (generally quartz) that is transparent to the electromagnetic waves produced by the generator.

After insertion of the container (generally made of a thermoplastic polymer material such as PET) into the enclosure, they are both depressurized to establish a high vacuum in the container (several µbars, 1 µbar being equal to $10^{-6}$ bar) necessary to establish the plasma, and in the enclosure outside the container a medium vacuum (on the order of 30 mbar to 100 mbar) to prevent the container from contracting from the effect of the difference in pressure on either side of its wall.

A precursor gas (such as acetylene, $C_2H_2$) is then introduced into the container, said precursor being activated by electromagnetic bombardment (this generally involves low power UHF microwaves at 2.45 GHz) in order to cause it to go through the cold plasma state and thus generate species including hydrogenated carbon (including CH, $CH_2$, $CH_3$), which is deposited in a thin layer (whose thickness is customarily between 50 and 200 nm, depending on the case, 1 nm being equal to $10^{-9}$ m) on the inner wall of the container.

During the treatment, it is essential to avoid any communication between the interior and the exterior of the container. Otherwise, the positive pressure outside the container would cause the injection of air into it and the oxidation of the species generated by the plasma, to the detriment of the quality of the deposited barrier layer.

This is the reason known treatment machines are equipped with sealing devices comprising an annular gasket against which the opening (also called mouth) of the container is applied when it is inserted into the machine. By way of illustration, reference can be made to French patent application FR 2 872 148 (Sidel) or to the equivalent international application WO 2006/000539, or to the American patent U.S. Pat. No. 5,849,366.

This technique can be improved. Indeed, leaks have been observed at the sealing gasket. These leaks are due to the progressive depositing on the gasket of carbonaceous species generated by the plasma. Over time, this deposit forms on the surface of the gasket a film that decreases the flexibility thereof, and gaps appear at the interface between the gasket and the mouth of the container. In order to prevent the occurrence of such leaks, the solution currently being used is to clean or replace the gasket, which involves shutting down the machine for the duration of this maintenance work.

SUMMARY OF CERTAIN EMBODIMENTS OF THE INVENTION

The invention seeks to improve the seal of container treatment machines.

To that end, the invention proposes a sealing device for a machine for the plasma treatment of containers, which comprises at least first and second annular sealing surfaces suitable for cooperating respectively with first and second separate annular zones of the neck of a container.

This device achieves a double seal on the container which makes it possible to reduce the frequency of cleaning or replacing the polluted gasket, thus benefiting productivity.

According to one embodiment, the first surface is suitable for cooperating with the mouth of the container. The second surface is, for example, suitable for cooperating with a collar of the container.

The sealing surfaces can be borne by at least one sealing gasket, and for example by two separate sealing gaskets.

According to one embodiment, the device comprises a sleeve suitable for receiving the neck of the container and forming a mounting structure for the sealing gasket or for each sealing gasket. Said sleeve comprises, for example, a cylindrical body extended by a tubular skirt. A first sealing gasket can be fitted into a counter-bore formed in the sleeve at the junction between the body and the skirt, while a second sealing gasket, for example, is mounted on the skirt. According to one embodiment, a vent hole places an internal space delimited by the skirt in communication with the exterior of the sleeve.

BRIEF DESCRIPTION OF THE DRAWINGS

The invention also proposes a machine for the plasma treatment of containers, which comprises a sealing device as described above.

Other objects and advantages of the invention will appear from the following description, with reference to the appended drawings in which.

DETAILED DESCRIPTION OF CERTAIN EMBODIMENTS OF THE INVENTION

Figure 1:
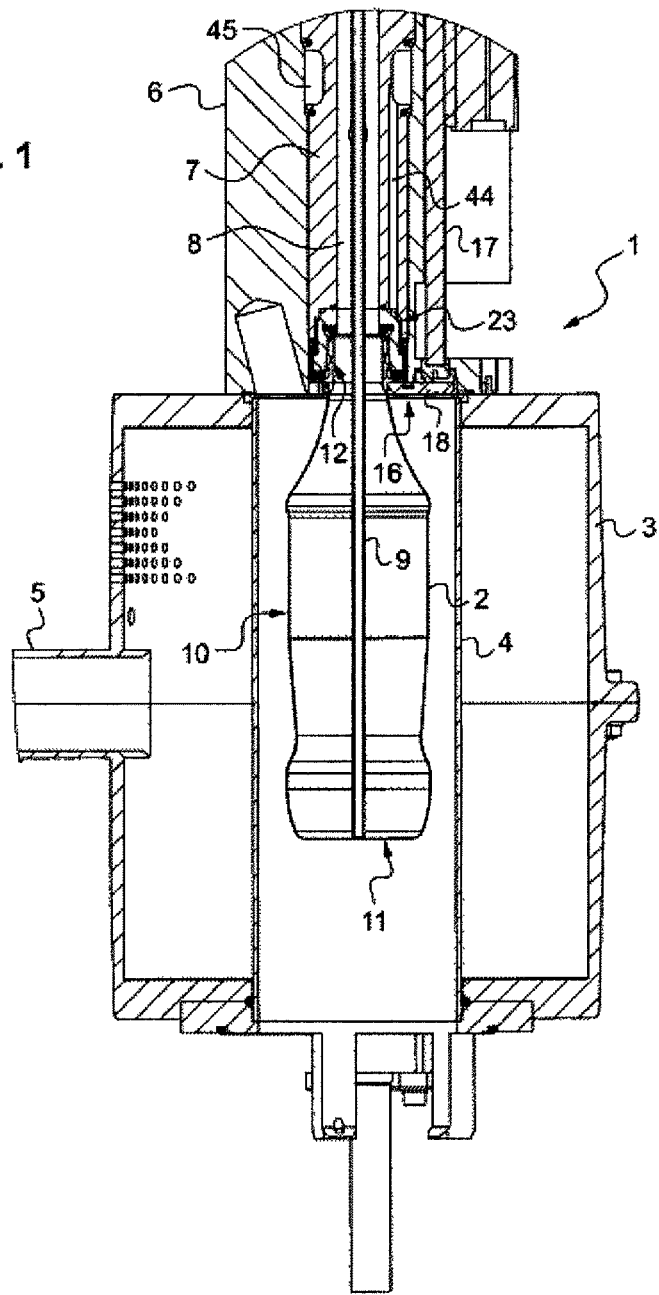
FIG. 1 is an elevation view in cross section of a container treatment machine comprising an improved sealing device.
Figure 2:
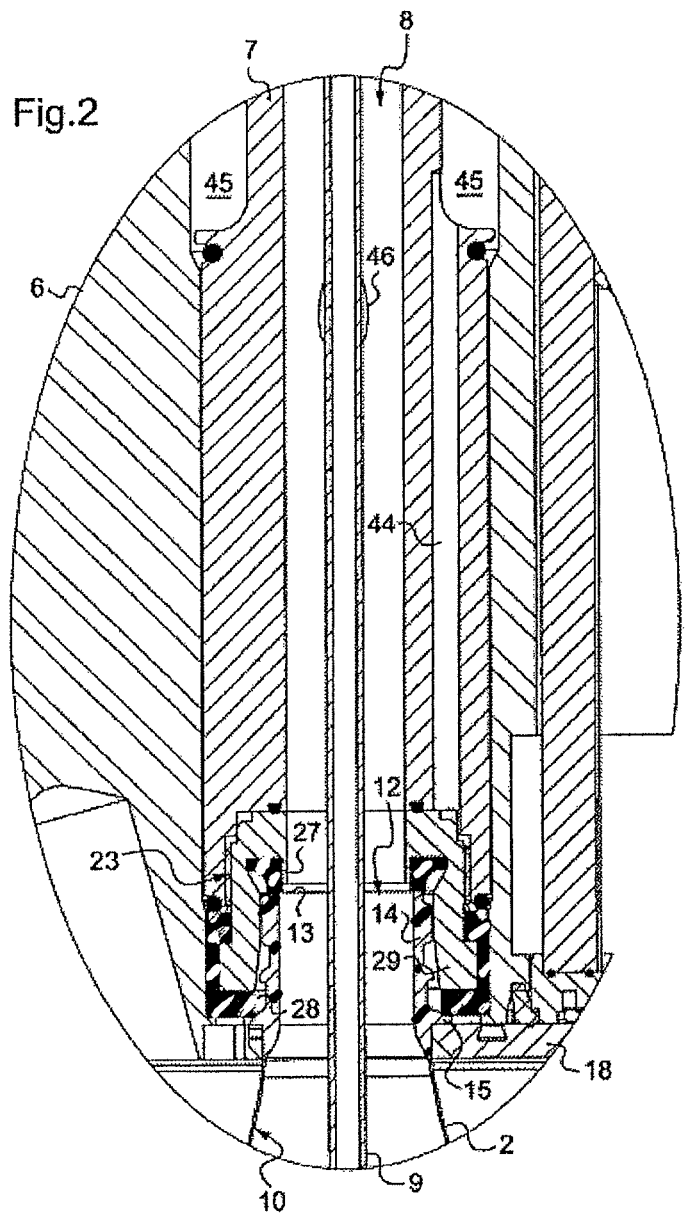
FIG. 2 is a cross-sectional view, in large scale, of a detail of the machine in FIG. 1.

Represented in FIG. 1 is a machine 1 for treating containers 2 previously formed by blowing or stretch-blowing from preforms made of plastic, such as PET. The treatment consists of the plasma deposition of a barrier layer composed of hydrogenated carbon on the inner wall of containers.

The machine 1 comprises a chamber 3 made of a conductive material such as steel, or preferably aluminum or aluminum alloy. Disposed in the chamber 3 is an enclosure 4 made of a material that is transparent to electromagnetic waves, such as quartz. The machine 1 also comprises a low power generator of electromagnetic waves at a frequency of 2.45 GHz, connected to the chamber 3 by a waveguide 5.

The chamber 4 is topped by a cover 6 in which is mounted a jacket 7 defining, in the extension of the enclosure 4 at an upper end thereof, a nozzle 8 through which an injector 9 passes axially; by means of said injector a precursor gas such as acetylene is introduced into the container 2.

The container 2 intended to be treated comprises a body 10 which defines the internal volume of the container 2, said body 10 terminating by a bottom 11 and being extended, opposite the bottom 11, by a neck 12 having a wall thickness greater than that of the body 10. The neck 12 defines an annular opening 13, also called mouth. On its outer wall, the neck 12 has protuberances 14 such as ribs or threading, by means of which a cap can be removably attached after the container 2 is filled. The neck 12 further comprises, below the protuberances 14 near the body 10, a collar 15 that allows the container 2 to be gripped during the different steps of its manufacture and filling.

The container 2 represented in the drawings is a bottle. Its neck 12 therefore has a smaller diameter than the body 10. However, the present description is not limited to bottles, but can apply to any type of container, including those that have a neck diameter that is equal to or even greater than that of the body.

The machine 1 is equipped with a device 16 for gripping the container 2, which comprises a rod 17 mounted slidably with respect to the cover 6, at a lower end of which rod a gripper 18, also called fork, is attached, which grips the container 2 under its neck 12 and provides the support thereof.

The gripping device 16 is movable between a lower position (not shown), in which the fork 18 emerges beneath the chamber 3 to allow the loading of a container 2, and an upper position (shown in the figures) in which the fork abuts an upper wall 19 of the chamber and holds the neck 12 of the container 2 inside the cover 6, in the extension of the nozzle 8.

To support the container 2, the fork 18 defines a semicircular opening 20 into which the container 2 is snapped and on an upper edge 21 of which it rests, supported by a lower face 22 of the collar 15.

The machine 1 is further equipped with a sealing device 23, mounted in the cover 6 at a lower end of the jacket 7. Said sealing device 23 comprises at least two sealing surfaces 24, 25 against which the container 2 is pressed by means of two different annular zones 13, 15 of its neck 12.

More specifically, a first sealing surface 24, called upper sealing surface, cooperates with the mouth 13 of the container 2, while a second sealing surface 25, called lower sealing surface, cooperates with the collar 15, and more precisely, with an upper face 26 thereof, opposite to the lower face 22.

The axial positioning of the sealing surfaces 24, 25 is arranged so that the mouth 13 and the upper face 26 of the collar 15 press against the sealing surfaces 24, 25 thanks to the elasticity of their respective supports.

The sealing surfaces 24, 25 are borne by at least one elastic gasket. According to a preferred embodiment, illustrated in the figures, the sealing surfaces 24, 25 are borne respectively by two separate elastic gaskets 27, 28, made of a compressible material such as silicone or rubber (natural or synthetic).

More specifically, the upper sealing surface 24 is formed on a first gasket 27, called mouth gasket, while the lower sealing surface is formed on a second gasket 28, called collar gasket.

In order to ensure the correct holding and positioning of the gaskets 27, 28, the sealing device 23 comprises a sleeve 29 made of a rigid material such as aluminum, or preferably steel. Said sleeve 29 has, next to the jacket 7 against which it presses and into which it is fitted (or preferably, screwed), a cylindrical body 30 pierced by a through-hole 31 that extends coaxially to and inside the extension of the nozzle 8. The body 30 is extended, opposite the jacket 7, by a tubular skirt 32 that internally defines a housing in which at least part of the neck 12 of the container 2 is received.

Figure 3:
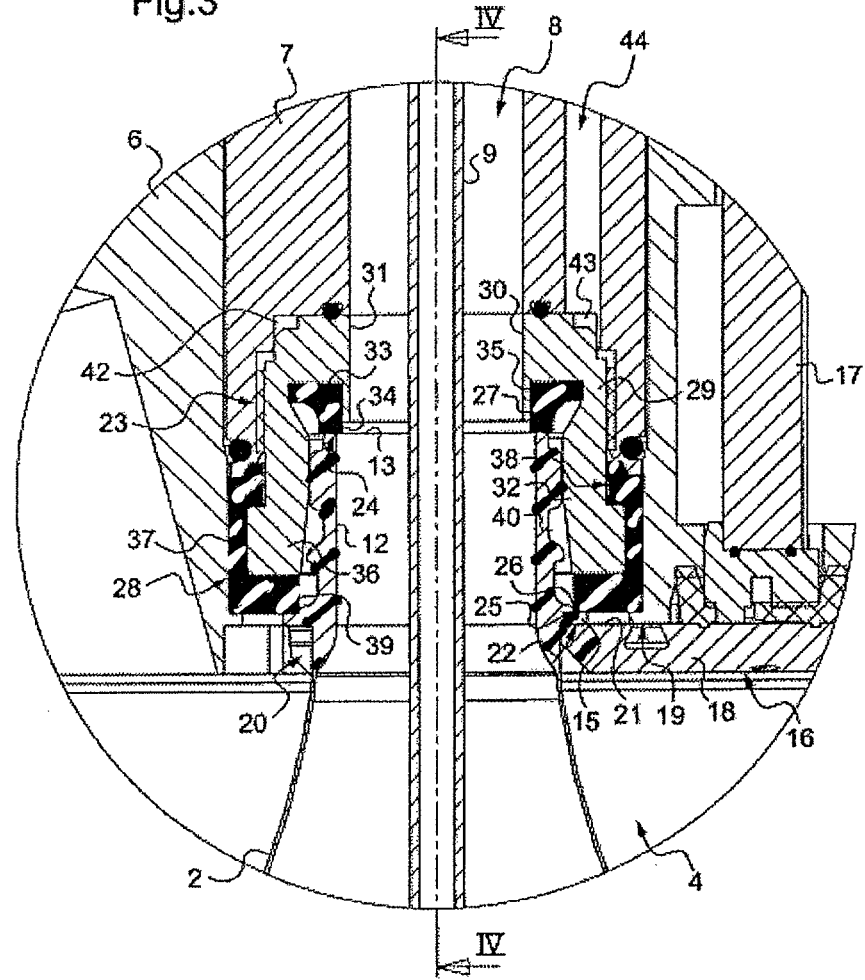
FIG. 3 is a cross-sectional view, in large scale, of a detail of the machine in FIG. 2, showing an improved sealing device.
Figure 4:
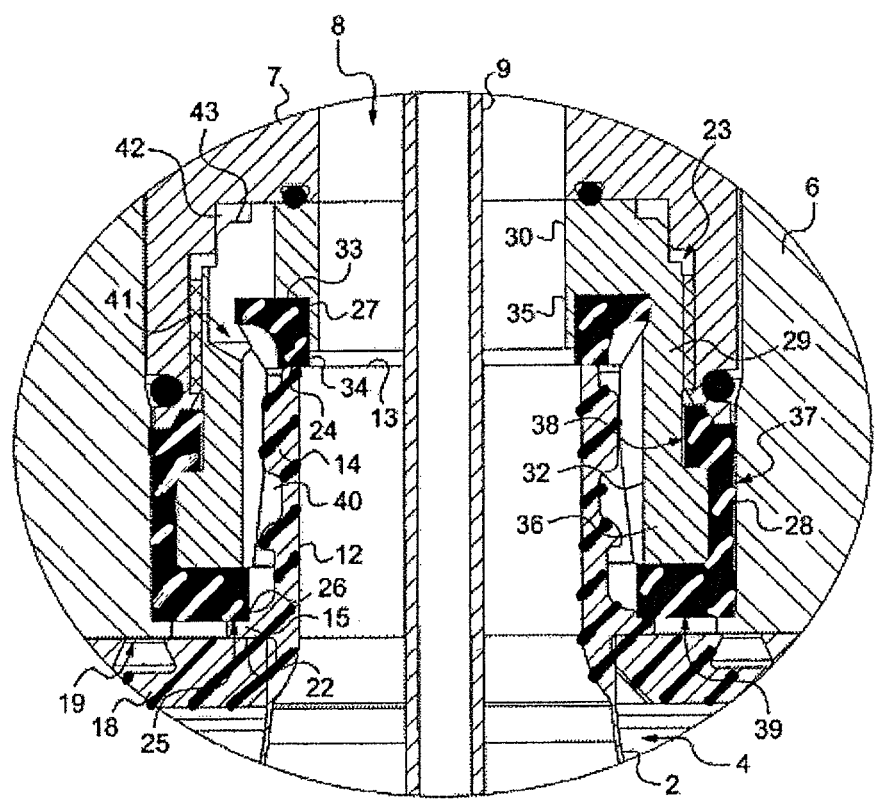
FIG. 4 is a detailed cross-sectional view of the sealing device of FIG. 3, along the sectional plane IV-IV.

As can be seen particularly in FIG. 3, the mouth gasket 27 has an angled profile in cross section; it is received into a counter-bore 33 made in the sleeve 29 at the junction between the body 30 and the skirt 32 and has a lower portion 34 which extends in projection toward the enclosure 4 and at the end of which the upper sealing surface 24 is formed, which extends annularly in a plane perpendicular to the axis of the nozzle 8. The upper sealing surface 24 is radially greater in size than the mouth 13, so that it extends beyond said mouth 13 and follows the curvature thereof in order to improve the seal of the contact.

The counter-bore is internally bordered by a tubular protrusion 35 which serves as a frame for the mouth gasket 27, in order to prevent the gasket 27 from becoming excessively flattened under the pressure exerted by the container 2.

The collar gasket 28 is mounted on the skirt 32 which serves as a frame for said collar gasket, and it is fitted onto an annular rim 36 that projects radially outward. The collar gasket 28 comprises a cylindrical central portion 37 that defines the rim 36, and on the one hand near the jacket 7 is extended beyond the rim 36 by a first annular return 38 of a lesser diameter, and on the other hand near the enclosure 4, by a second annular return 39 that axially extends the skirt 32 and at the end of which the lower sealing surface 25 is formed, which, like the upper surface 24, extends annularly in a plane perpendicular to the axis of the nozzle 8.

The mouth gasket 27, in contact with the plasma, can become covered little by little with carbonaceous particles during repeated treatment cycles. However, such a deposit does not result in the appearance of leaks between the container 2 and the enclosure 4, thanks to the presence of the collar gasket 28. One advantage thereof is that this double sealing allows maintenance work to clean or replace the collar gasket 27 to be carried out less frequently.

The neck 12 of the container 2 on the one hand, and the sleeve 29 and gaskets 27, 28 on the other hand, define an annular interstice 40 between them that is isolated from the interior of the container 2 by the mouth gasket 27, against which the mouth 13 is pressed, and the enclosure 4 by the collar gasket 28 against which the collar 15 is pressed.

When the neck 12 is inserted into the sleeve 29, before treatment begins said interstice 40 is at atmospheric pressure. Because a vacuum is produced in the container 2 as well as in the enclosure 4, there is a risk that the positive pressure then in the interstice 40 would cause leaks at the gaskets 27, 28. In order to eliminate this risk, the interstice 40 is connected to the nozzle 8 by means of vent holes 41 made radially and/or axially in the body 30 of the sleeve 29, said vent holes 41 placing the space delimited internally by the skirt (and thus the interstice 40) in communication with an outer face of the sleeve 29, and more specifically with an annular space 42 defined between the jacket 7 and the sleeve 29 by means of a counter-bore 43 made in said sleeve.

A channel 44, bored axially in the thickness of the jacket 7, opens into said annular space 42 which places it in communication with an annular chamber 45 hollowed out in the jacket 7, which chamber 45 communicates with the nozzle 8 by oblique holes 46, as well as with a duct to the open air by means of an electrically operated valve (not shown).

Thus, when the container 2 is placed in a vacuum, the residual air present in the interstice 40 is drawn out via the vent holes 41 and the channel 44. In the end, the pressure in the interstice 40 is equal to, or essentially equal to, the pressure in the container 2. The (slight) difference in pressure that exists on either side of the collar 15 thus tends to advantageously press the collar more against the collar gasket 28.

Furthermore, when the container 2 is returned to atmospheric pressure, unpolluted air reaches the interstice 40 from the chamber 45 (which connects to the open air by the opening of the electrically operated valve), via the channel 44. The result is minimal pollution of the interstice 40 and thus of the sealing surface 25.

The invention is not limited to the embodiments just described.

In particular, although the gaskets 27, 28 as described above are preferably parts manufactured separately from the sleeve 29, added and attached thereto simply by fitting or nesting, they could as a variation be molded onto the sleeve 29.

In the same way, we have seen that the sealing surfaces 24, 25 are made on two separate gaskets 27, 28. As a variation, these surfaces could pertain to a single gasket which could, for example, be molded onto the sleeve 29. In this possibility, the gasket could cover the inner face of the skirt 32.

Moreover, irrespective of the number of gaskets, the number of sealing surfaces could be more than two, or they could press against annular zones other than the mouth 13 or collar 15.

The invention claimed is:

1. A double sealing device for a machine for the plasma treatment under high vacuum of containers in combination with a container, comprising at least first and second annular sealing surfaces cooperating respectively with first and second separate annular zones of a neck of a container, the neck of the container having protuberances for removably attaching a cap, the neck further comprising a collar below the protuberances, the first annular sealing surface is an upper annular sealing surface cooperating with a mouth of the container, the second annular sealing surface is a lower annular sealing surface cooperating with the collar of the container, the first and second annular sealing surfaces are borne respectively by two separate upper and lower elastic gaskets made of silicone or rubber, the double sealing device further comprising a sleeve made of a rigid material, the sleeve having a cylindrical body and a through-hole, the cylindrical body extending by a tubular skirt, the upper elastic gasket, in contact with the plasma, having an angled profile in cross section and received in a counter-bore made in the sleeve at a junction between the body and the skirt and having a lower portion at an end of which the upper sealing annular surface is formed, the counter-bore being internally bordered by a tubular protrusion configured as a frame for the upper elastic gasket, and the lower elastic gasket is mounted on the skirt and is fitted onto an annular rim that projects radially outward the skirt.

2. The double sealing device as claimed in claim 1, wherein the sleeve is configured to receive the neck of the container, said sleeve forming a mounting structure for one of the elastic gaskets or for each elastic gasket.

3. The double sealing device as claimed in claim 1, which further comprises at least one vent hole that places an internal space delimited by the skirt in communication with the exterior of the sleeve.

4. A machine for the plasma treatment of containers, which comprises a double sealing device as claimed in claim 1.

5. A machine for the plasma treatment of containers, comprising:
   a container having a neck with a mouth and a collar; and
   a double sealing device comprising a first annular sealing surface and a second annular sealing surface configured to seal against the container under high vacuum;
   wherein the first annular sealing surface is in sealing contact with the neck and the second annular sealing surface is in sealing contact with the collar;
   the first annular sealing surface is an upper annular sealing surface cooperating with the mouth of the container, the second annular sealing surface is a lower annular sealing surface cooperating with the collar of the container, the first and second annular sealing surfaces are borne respectively by two separate upper and lower elastic gaskets made of silicone or rubber, the sealing device further comprising a sleeve made of a rigid material, the sleeve having a cylindrical body and a through-hole, the cylindrical body extending by a tubular skirt, the upper elastic gasket having an angled profile in cross section and received in a counter-bore made in the sleeve at a junction between the body and the skirt and having a lower portion at an end of which the upper sealing annular surface is formed, the counter-bore being internally bordered by a tubular protrusion configured as a frame for the upper elastic gasket and the lower elastic gasket is mounted on the skirt and is fitted onto an annular rim that projects radially outward the skirt.

6. The machine according to claim 5, further comprising a vent hole that places an internal space delimited by the skirt in communication with the exterior of the sleeve.

* * * * *